United States Patent [19]

Zastrow et al.

[11] Patent Number: 5,442,796
[45] Date of Patent: Aug. 15, 1995

[54] PULSE GENERATOR AND DEMODULATOR WITH CONTROLLING PROCESSOR AND DECREMENTING COUNTERS

[75] Inventors: Lyn R. Zastrow, Coppell, Tex.; James L. Goodhart, Cupertino, Calif.

[73] Assignee: Zilog, Inc., Campbell, Calif.

[21] Appl. No.: 855,246

[22] Filed: Mar. 23, 1992

[51] Int. Cl.⁶ .................. G06F 3/023; G06F 7/62; G06F 15/20

[52] U.S. Cl. .................. 395/800; 364/231.31; 364/232.8; 364/232.93; 364/234.4; 364/237.9; 364/238.3; 364/238.7; 364/251.4; 364/267.4; 364/270.4; 364/271.4; 364/270.9; 364/271.1; 364/DIG. 1; 364/DIG. 2; 340/825.69

[58] Field of Search .............. 395/800, 100, 375, 250, 395/550, 500, 425, 400, 275, 750, 775, 148, 154, 155; 364/DIG. 1, DIG. 2, 413.01; 340/825.69, 825.56, 825.72; 375/1, 119; 377/52, 110; 359/148

[56] References Cited

U.S. PATENT DOCUMENTS

| 4,084,082 | 4/1978 | Altke ................. 377/52 |
| 4,264,864 | 4/1981 | Takeda ............... 377/110 |
| 4,400,817 | 8/1983 | Sumner ............... 375/119 |
| 4,626,348 | 12/1986 | Ehlers ............. 340/825.69 |
| 4,825,200 | 4/1989 | Evans et al. ...... 340/825.56 |
| 4,866,434 | 9/1989 | Keenan ............ 340/825.72 |
| 4,959,810 | 9/1990 | Darbee et al. ........ 395/100 |
| 5,109,221 | 4/1992 | Lambropoulos et al. .. 340/825.69 |
| 5,142,398 | 8/1992 | Heep ................. 359/148 |

FOREIGN PATENT DOCUMENTS 223377 1/1991 United Kingdom.

Primary Examiner—Alyssa H. Bowler
Assistant Examiner—Daniel H. Pan
Attorney, Agent, or Firm—Majestic, Parsons, Siebert & Hsue

[57] ABSTRACT

A central processing unit (CPU) and a dedicated pulse generating and demodulating logic circuit are used to both generate and demodulate a wide variety of pulse signals. Although the CPU exercises general supervision of the dedicated logic circuit, the circuit is arranged to perform most operations independently. Counters, registers and controlling logic generate a pulse stream. This same circuit, with the addition of edge detectors, demodulates (learns) the characteristics of an existing pulse signal in order to be able to generate a replica of that existing signal. An example application of the circuit is with television and other electronic equipment remote control units that include a learning capability.

26 Claims, 11 Drawing Sheets

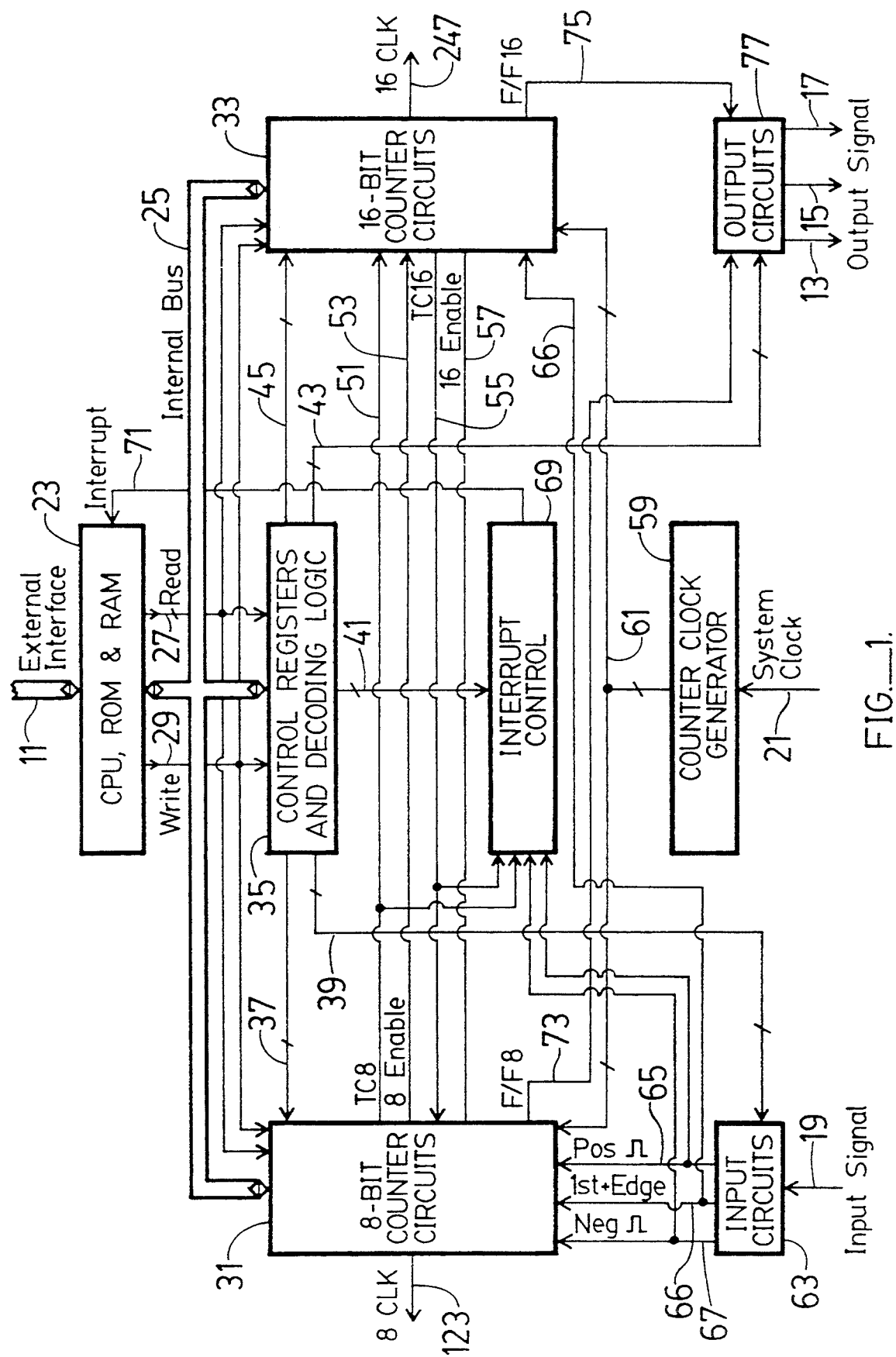
FIG._1.

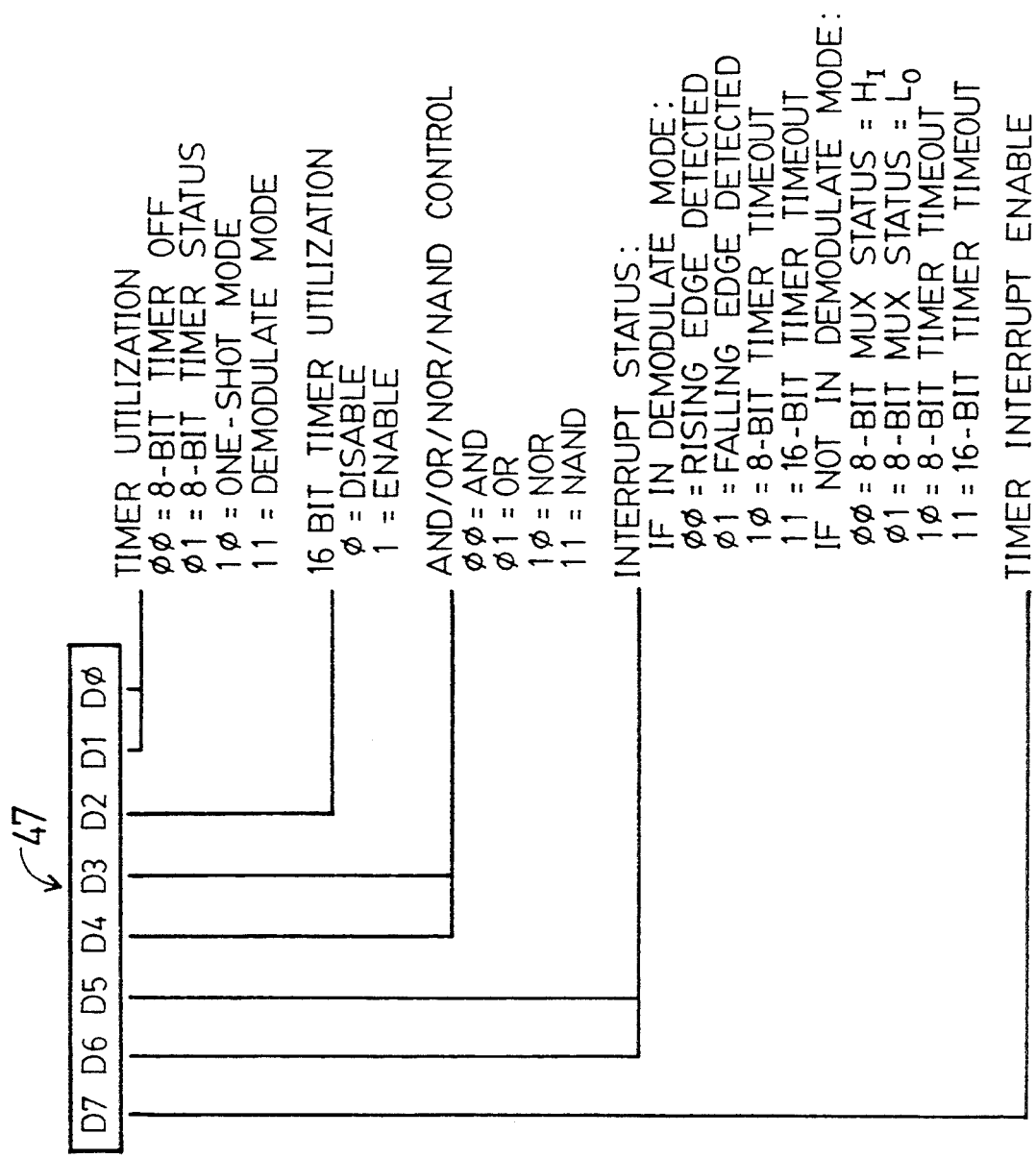
FIG._2.
(TMR Control Register)

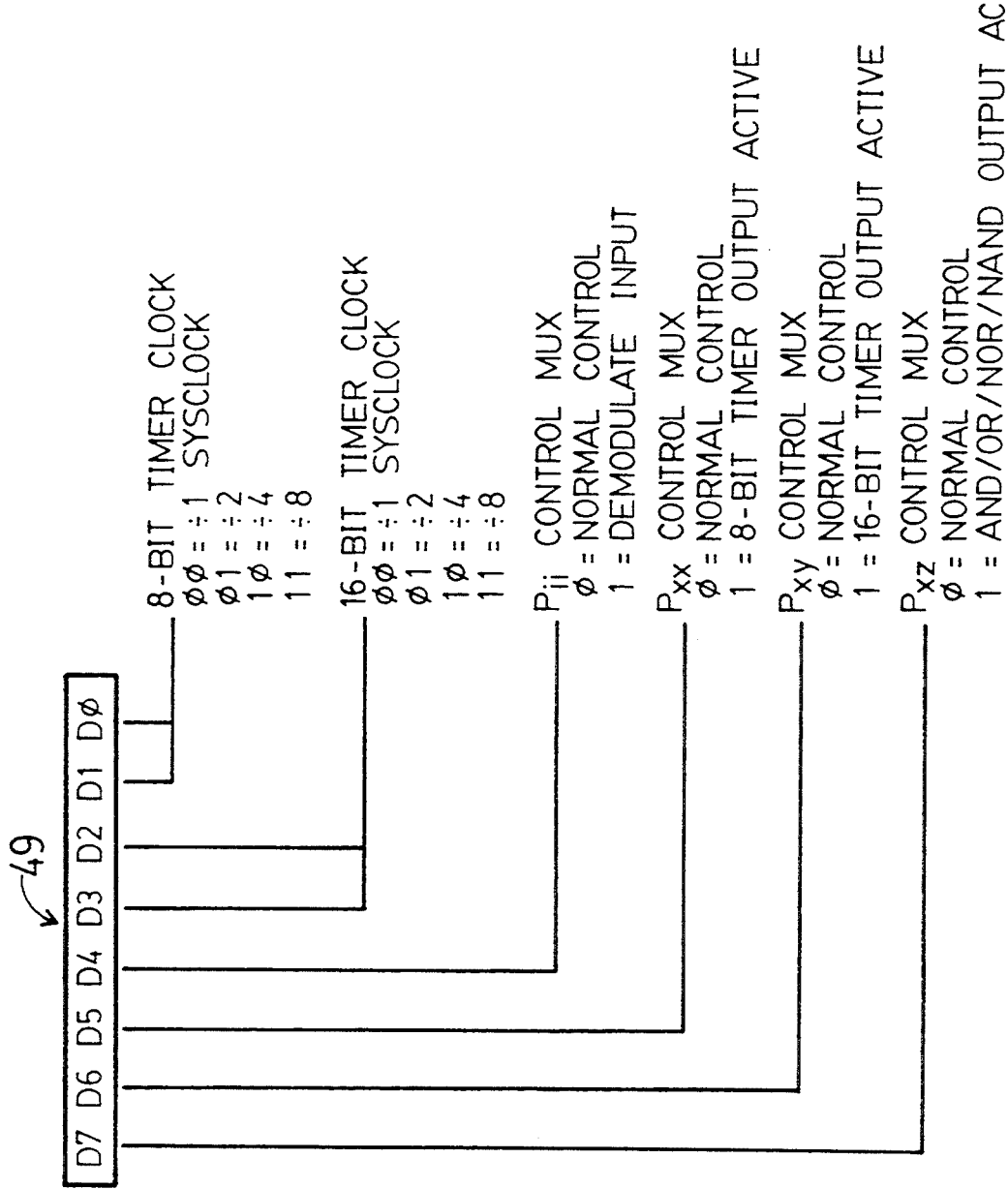
FIG._3.
(PWM Control Register)

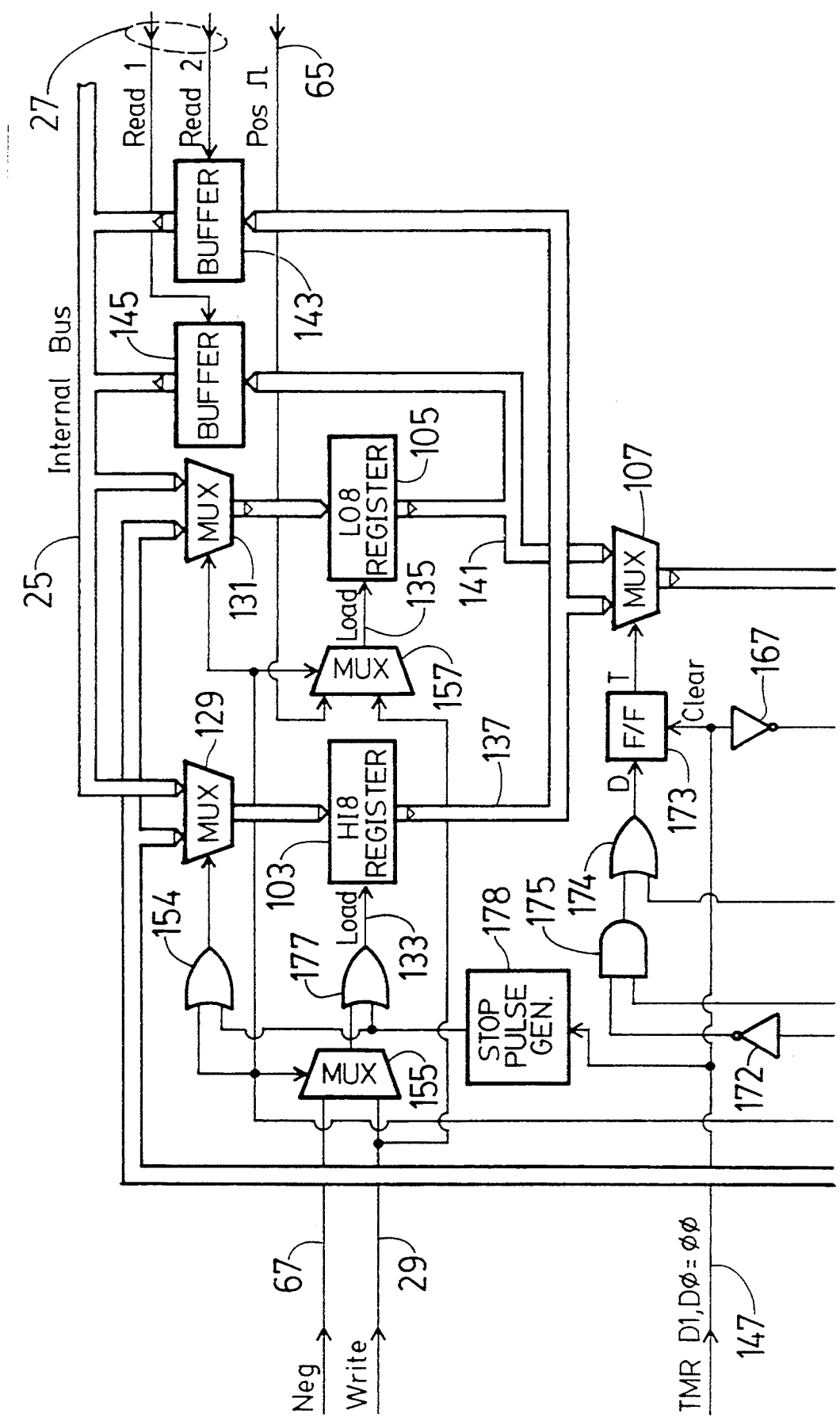
FIG._4A. (8-BIT Counter Circuits 31)

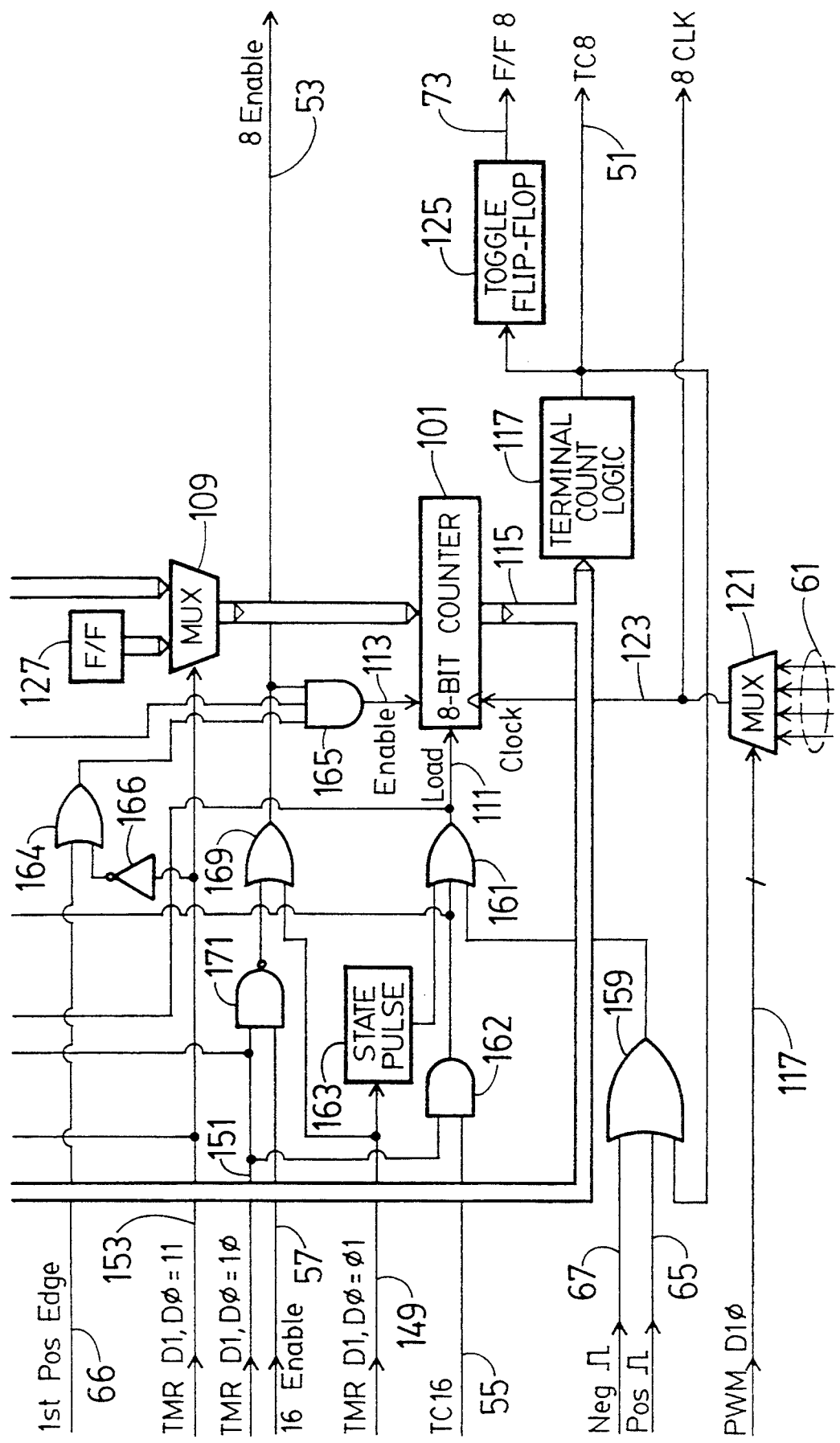
FIG._4B.
(8-BIT Counter Circuits 31)

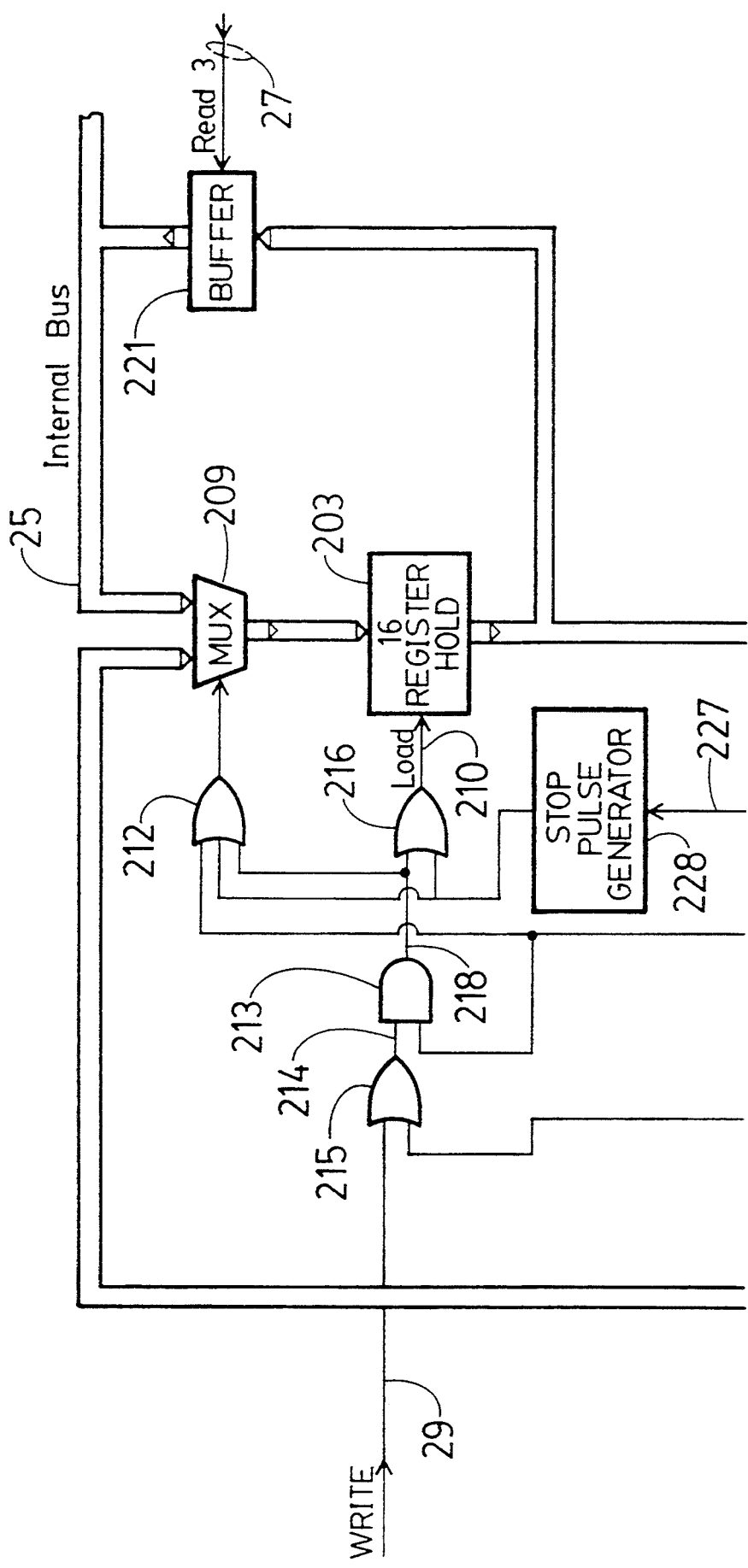
FIG._5A.
(16-BIT Counter Circuits 33)

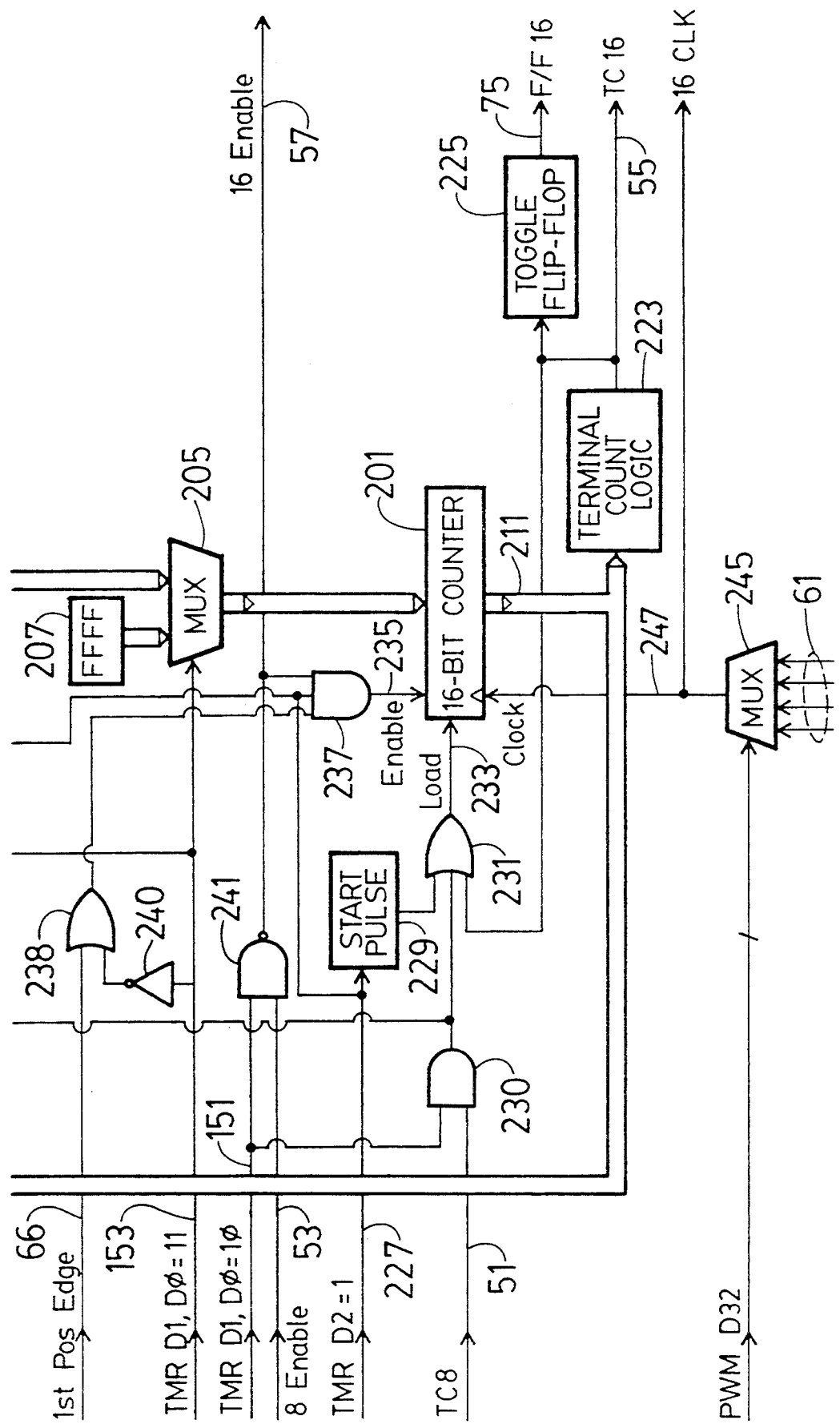
FIG._5B.
(16-BIT Counter Circuits 33)

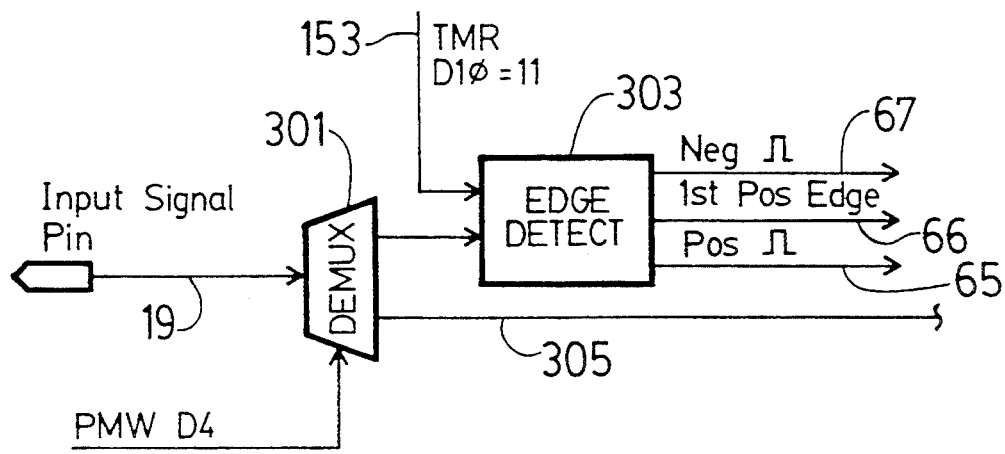
FIG._6.
(Input Circuits 63)
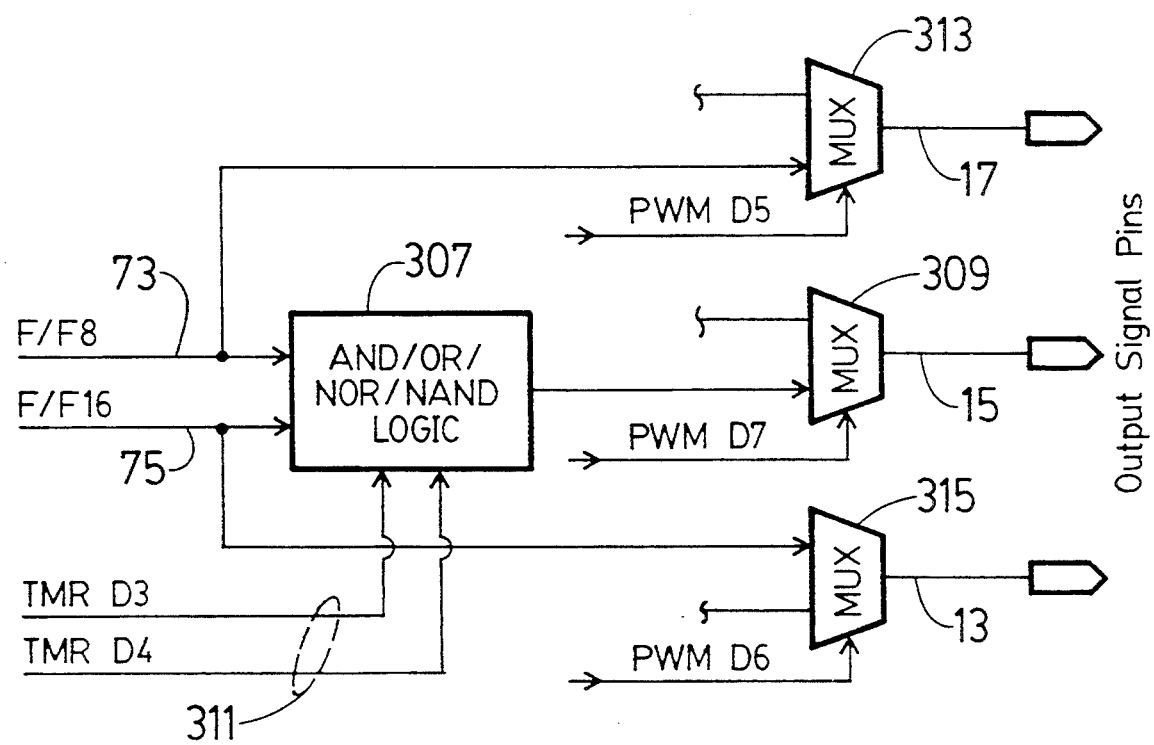
FIG._7.
(Output Circuit 77)

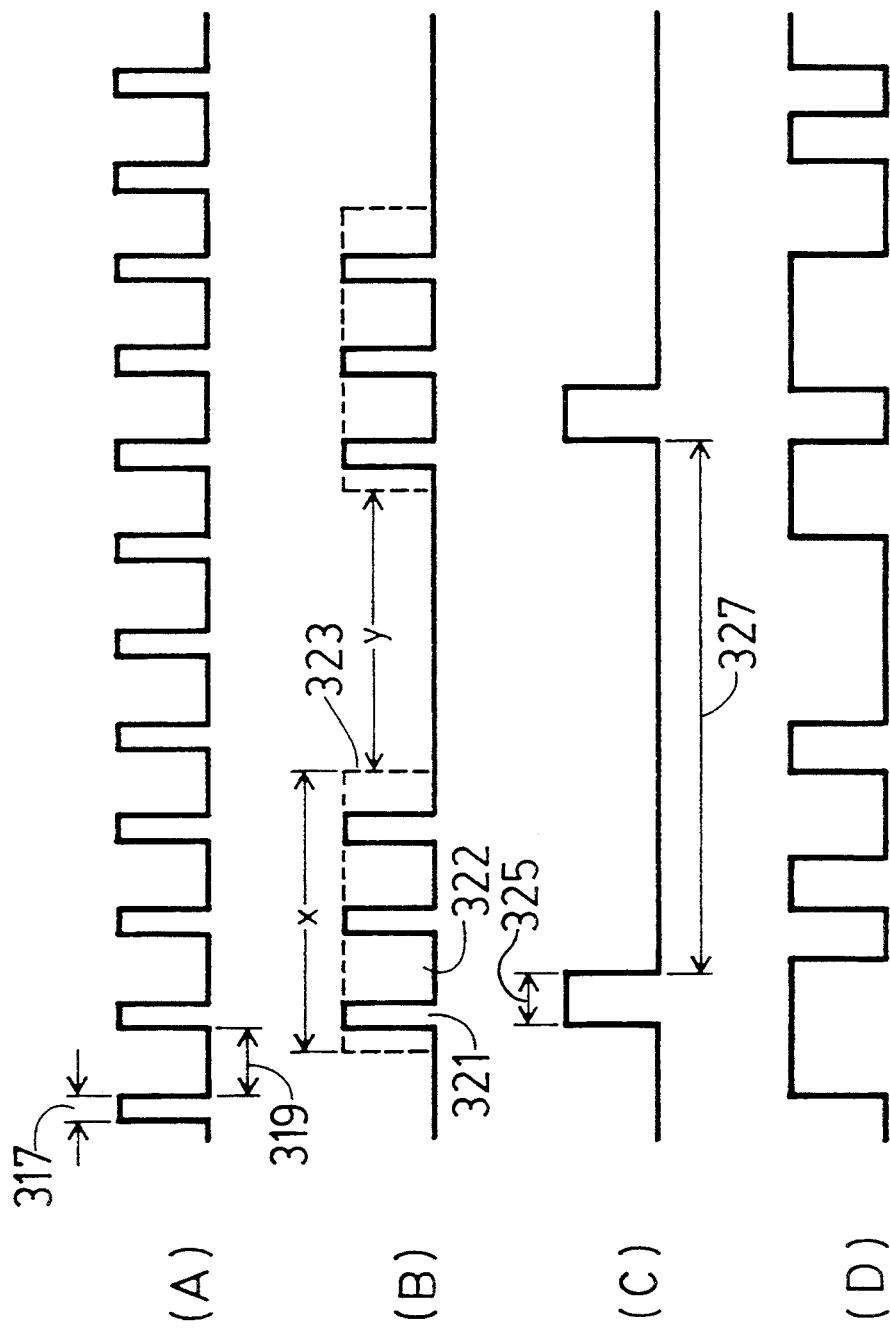
FIG._8.
(Generation Mode)

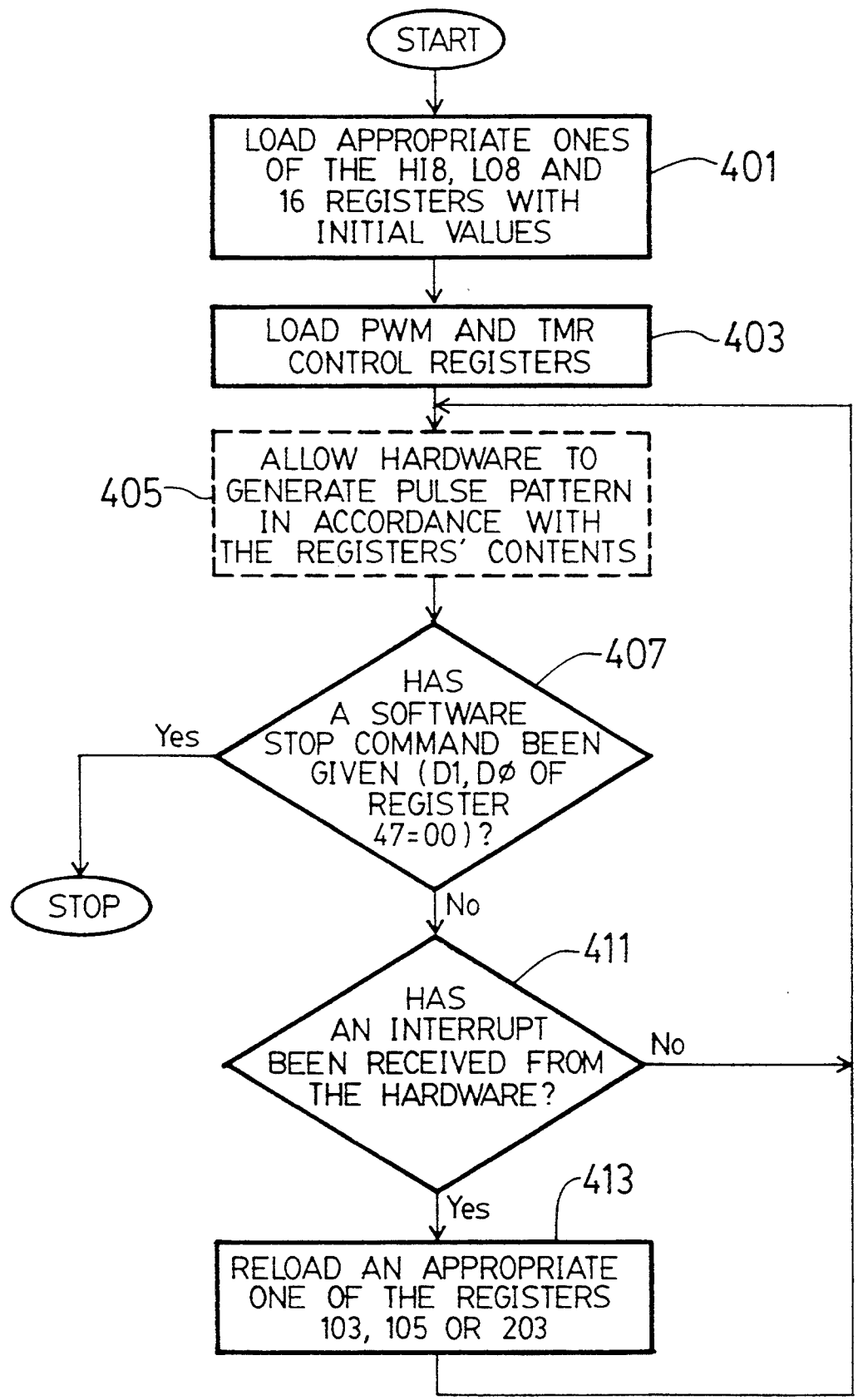
FIG._9A.
( General CPU Operation during Pulse Generation )

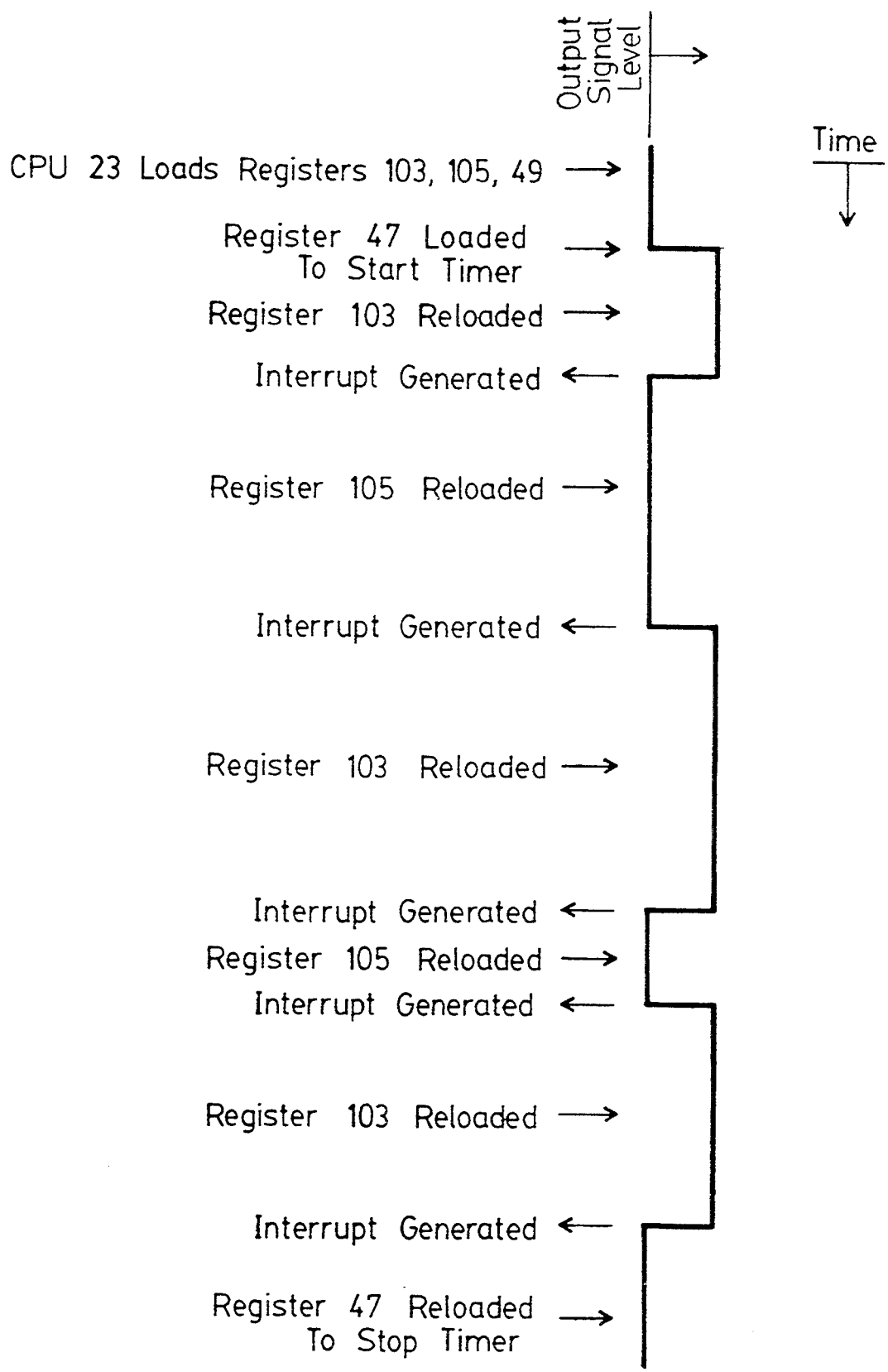
FIG._9B.

PULSE GENERATOR AND DEMODULATOR WITH CONTROLLING PROCESSOR AND DECREMENTING COUNTERS

BACKGROUND OF THE INVENTION

This invention relates generally to programmable pulse generators and, more specifically, to those which also have a pulse demodulating (learning) mode of operation.

An example of wide spread use of pulse generators is in the field of remote controls for television and other consumer electronic products. Unique pulse signals are electrically generated within a hand held remote control unit. These pulses are remotely communicated to the electronic equipment to be controlled by an infra-red beam. Unique infra-red pulse signals are generated for various specific control functions. One pulse signal will be generated in response to the user pressing a television channel increment button, for example, another unique pulse train for changing the sound level, as so forth. The television or other equipment receiving the pulses recognizes the function to be performed by each and executes the requested function.

The consumer electronics industry has developed without a standard set of signals for such functions. Various manufactures have their own unique set of pulse signals to remotely control various specific functions. As a result, user programmable hand held remote units have become popular. A user may program such a unit to control a number of pieces of different equipment from various manufacturers, such as a television, video tape recorder, video disc player, audio components, and the like. Programming is accomplished by directing into the hand held unit, one at a time, the various specific infra-red pulse signals that are desired to be generated by it. The unit then demodulates the signal and stores the characteristics so learned in memory. These characteristics are then used to generate a replica of the pulse train when the user later calls upon it. The heart of such a programmable hand held remote control unit is its electronic system.

An example of such an electronic system is disclosed in U.K. Patent Application No. 2,234,377, published Jan. 30, 1991. A circuit combination of counters, registers and logic are provided on an integrated circuit chip for both generating and demodulating pulse signals, under control of a central processing unit (CPU) on another integrated circuit chip. It is a primary object of the present invention to provide an improved pulse generating and demodulating system of the type there disclosed.

It is a more specific object of the present invention to provide this type of circuit with the ability to generate and demodulate signals with a reduced need for supervision and real time control by the CPU.

It is another object of the present invention to provide a pulse generating and demodulating system with greater generality and flexibility for handling a wider range of pulse modulation.

It is a further object of the present invention to provide such a pulse generating and demodulating system that, in addition to having utility in hand held remote controls, is also useful in other applications where either a programmable pulse generator and/or pulse demodulator is required.

SUMMARY OF THE INVENTION

These and additional objects are accomplished by the various aspects of the present invention, wherein, briefly and generally, a dedicated pulse generating and demodulating circuit is combined with a controlling CPU on a single integrated circuit chip but in a manner that minimizes the amount of supervisory control of the CPU that is necessary. The CPU communicates with the pulse generating and demodulating circuit primarily through a few data and control registers, the circuit operating to execute a specific pulse generating or pulse demodulating function with the CPU having to do little more than read or write to various data registers in synchronism with the circuit's operation. This allows the pulse generating and demodulating circuit to operate with reduced waiting upon the CPU and thus faster, and with an ability to handle more difficult types of pulse signals. A common set of data registers is used during either the pulse generating or demodulating mode. A pair of counters provides programmed durations of the pulses. The circuit has the ability to automatically switch between counters and/or between registers in both the pulse generating and demodulating modes, not requiring instructions from the CPU for doing so. In addition to providing an improved electronic system for a hand held remote unit, the present invention has applicability in a wide variety of applications, such as a motor control, any pulse code modulation (PCM) application, any pulse code demodulation (PCD) application, and even as a core component of a digital-to-analog converter circuit (DAC).

Additional objects, advantages and the many features of the various aspects of the present invention will become apparent from the following description of a preferred embodiment thereof, which description should be taken in conjunction with the accompanied drawings.

BRIEF DESCRIPTION OF THE DRAWINGS

FIG. 1 shows in block diagram form a complete programmable pulse generator and demodulator system that can be implemented on a single integrated circuit chip;

FIGS. 2 and 3 show details of control functions implemented by two control registers included in the system of FIG. 1;

FIG. 4 provide details circuits of the system of FIG. 1; circuits of the system of FIG. 1;

FIG. 5 provides circuit details of the other of the counter circuits of the system of FIG. 1;

FIG. 6 is an example of the input circuits of the system of FIG. 1;

FIG. 7 is an example of the output circuits of the system of FIG. 1;

FIG. 8 show exemplary pulse signals that can be generated by the system of FIGS. 1–7;

The flowchart of FIG. 9A generally illustrates operation of the CPU in the system of FIGS. 1–7 when in a pulse generating mode; and FIG. 9B illustrates operation of the CPU in the system of FIGS. 1–7 to generate a specific example pulse waveform.

DESCRIPTION OF A PREFERRED EMBODIMENT

The example programmable pulse generating and demodulating system of FIG. 1 is preferably implemented as a single integrated circuit chip, the inputs and outputs illustrated in FIG. 1 being connected to pins of an integrated circuit package in which the system chip is carried. An interface 11 provides for interconnection with other devices, such as a keypad, or a host computer system. Three output lines 13, 15 and 17 provide three alternative forms of a pulse signal being generated by the system. An input line 19 carries a pulse signal that is demodulated by the system. The line 21 supplies a system clock for its operation.

A controlling central processing unit (CPU) and associated functions, such as a read only memory (ROM) that stores a controlling operating program, and general purpose random access memory (RAM), is indicated by a block 23. The CPU communicates with the dedicated hardware portion of the system over an internal bus 25, read control lines 27 and a write control line 29. These circuits communicate directly with two counter circuits 31 and 33, and control registers 35. A principal means of communication is for the CPU 23 to read and write the contents of registers in circuit portions 31, 33 and 35. As is shown in detail below, registers within the counter circuits 31 and 33 are loaded by the CPU 23 with data that controls the characteristics of the pulses generated by the system when in a pulse generating mode, and read the contents of those same registers when in a pulse demodulating (learning) mode. Control of the system operation is effected by the CPU 23 loading one or more control registers within the block 35. One such control function is to set the system into either a pulse generating or pulse demodulating mode. The block 35 is indicated, for simplicity, to include decoding logic, decoded control signals then being provided to other major blocks of the FIG. 1 system by groups of lines 37, 39, 41, 43 and 45. Two eight-bit control registers 47 and 49 (FIGS. 2 and 3 respectively) are utilized within the block 35 in this specific example.

As discussed in detail below with respect to FIGS. 4 and 5, counter circuits 31 and 33 each include a digital counter that controls some aspect of the width of pulses being generated, when the system is in a pulse generating mode, and measure the duration of some aspect of pulses being received by the system, when it is in a demodulating mode. Circuits interconnecting the two counter circuits 31 and 33 include a line 51 carrying a signal that indicates when the counter of the circuits 31 has reached its terminal count, and a signal in a line 53 which indicates when the counter of the circuits 31 is enabled. Similarly, a line 55 carries a signal indicating when the counter of the circuits 33 has reached a terminal count, and a line 57 carries a signal indicating when the counter of the circuits 33 is enabled. In this example, the circuits 33 includes a 16-bit digital counter, while the circuits 31 include an 8-bit digital counter. This difference allows each of the circuits 31 and 33 to handle different pulse widths since their counters have a different cycle duration when operating at the same clock speed.

A clock generator circuit 59 takes a single system clock signal from an input line 21 and, in this example, generates several clock signals in circuits 61 that have different frequencies. A desired clock signal is chosen for each of the counter circuits 31 and 33 to adjust the counting speed of their respective digital counters. The selected clock signals are also provided as outputs of the integrated circuit.

Input circuits 63 consist primarily of edge detectors that generate a pulse in a line 65 when a positive going edge is received in a signal in the incoming line 19, and a pulse in a line 67 when a negative going edge is so received. These positive and negative edge pulses are connected with the counter circuits 31 and utilized when the system is in a pulse demodulating mode. Another signal generated by the input circuits 63 in a line 66, connected to both of the counter circuits 31 and 33, provides a pulse on the occurrence, in a signal being received on the line 19, of the first positive edge after the system is set into its demodulating mode.

The lines 65 and 67 are also connected with interrupt control circuits 69 as are the respective terminal count signals of the two counters that occur in lines 51 and 55. The occurrence of any one of these four events can generate an interrupt signal in a line 71 that is connected to an interrupt input of the CPU 23. As will be seen from the discussion below, this interrupt signal is used by the CPU 23 to know that data is available for reading in the registers within the counter circuits 31 and 33, when in a pulse demodulating mode, or to know that data can now be written into those registers, when in a pulse generating mode. The CPU 23 has control over which events will cause an interrupt signal in the line 71 by writing to interrupt status fields within the control registers 35.

An output line 73 of the counter circuits 31 contains a signal that is toggled between high and low values on each occurrence of its counter reaching its terminal count. A similar signal is generated in a line 75 as an output of the counter circuits 33. These signals are logically combined in controlled ways by output circuits 77 to provide an output signal in one or more of the lines 13, 15 and 17, when the system is operating in a pulse generating mode.

The counter circuits 31 are given in FIG. 4. A major component is an eight bit digital counter 101. Two 8-bit registers 103 and 105 are also provided. When the system is operating in a pulse generating mode, the contents of one of these registers 103 or 105 is selected at one time by a multiplexer 107 for loading, through another multiplexer 109, into the counter 101. A load signal in a line 111 accomplishes this, and an enable signal in a line 113 then causes the counter 101 to start counting down from the number so loaded. This count is monitored on a counter output bus 115 by terminal count logic 117 which causes a pulse to occur in the line 51 when the counter 101 has counted down to some preset terminal count, usually binary zero. The speed of operation of the counter 101 is selected by bits D0 and D1 from the control register 49 (FIG. 3) through lines 119 (part of control register lines 37 of FIG. 1) operating a multiplexer 121 to select one of several different clock speeds available in lines 61 for application to the counter 101 through a line 123. Line 123 is also provided as an output of the integrated circuit. Each time a terminal count pulse occurs in the line 51, the state of a toggle flip-flop circuit 125 is changed, thus providing that changed signal level in the line 73.

When in a pulse demodulating (learning) mode, the same registers 103 and 105 are utilized to store resulting counts of the counter 101 that correspond to widths of pulses in the input signal in line 19 (FIG. 1). In this mode, the multiplexer 109 is caused to disconnect the registers 103 and 105 from the input to the counter 101 and instead connect a fixed count, generally the highest count of the counter 101, from a circuit 127. The output 115 of the counter 101 is then connected to the inputs of the registers 103 and 105 through respective multiplexers 129 and 131. Whatever is at the output of the multiplexers 129 and 131 is loaded into their respective registers 103 and 105 upon a loading pulse in respective lines 133 and 135.

As previously mentioned, the CPU 23 (FIG. 1) is provided with the ability to read the contents of, and write the contents into, the registers 103 and 105. When the multiplexers 129 and 131 connect the internal bus 25 to the input of their respective registers 103 and 105, data on the internal bus 25 will be written into a selected one of those registers. Similarly, the internal bus 25 is connected to outputs 137 and 141 of the registers 103 and 105, respectively, by respective tri-statable buffers 143 and 145. The switches are rendered conductive in response to appropriate read signals in control lines 27 from the CPU 23. When so activated, the CPU 23 has access to the output of a selected one of the registers 103 or 105.

The control lines 37 (FIG. 1) include control lines 147, 149, 151 and 153 illustrated in FIG. 4. These four lines carry all the control signals possibly decoded from the first two bits D0 and D1 of the TMR control register 47, as illustrated in FIG. 2. The control signal in the line 147 is active when those two bits are both zero and inactive for all other values of those two bits. Similarly, the line 149 carries a control signal from the block 35 (FIG. 1) that is active when bit D0 is a 1 and bit D1 is a 0. In the same manner, the line 151 carries an active signal when the bit D0 is 0 and the bit D1 is a 1. An active signal occurs in the line 153 when both of those bits are 1 and an inactive signal for all other combinations of those two bits. The function of each of these four bit combinations is set forth in FIG. 2. The function of each in operating the circuits of FIG. 4 will now be given. These bits are loaded into the register 47 by the CPU 23 (FIG. 1) operating through the internal bus 25 and various control lines.

The control signal in the line 153 designates whether the circuit of FIG. 4 is operating to demodulate an existing pulse stream, where both bits D0 and D1 of register 47 are ones, or to generate a pulse stream, in which case the bits are any combination other than both ones. This control signal switches the multiplexers 109, 129 (through an OR-gate 154), 131 and additional multiplexers 155 and 157. When in the demodulate mode, a multiplexer 109 is switched to connect the fixed starting count from circuit 127 into the counter 101. When in the pulse generating mode, the output of the multiplexer 107 is connected with the input of the counter 101. The multiplexers 129 and 131, when the control signal 153 indicates the demodulate mode, connect the output 115 of the counter 101 to the input of each of the registers 103 and 105 respectively. When in the pulse generating mode, the multiplexers 129 and 131 connect the internal bus 25 to these registers so that they may be written to by the CPU 23, either once or on a dynamic basis when pulses are being generated. The multiplexers 155 and 157 are switched to connect the write control line 29 to the respective load inputs 133 (through an OR-gate 177) and 135 of the registers 103 and 105, when in a pulse generating mode. The negative and positive edge pulses in respective lines 65 and 67 cause the value of the counter 101 to be captured in one of the selected registers 103 and 105 when in the demodulate mode. The multiplexer 155 connects the negative edge pulse line 67 to the load input 133 of the register 103, and the multiplexer 157 connects the positive edge pulse signals in the line 65 to the load input 135 of the register 105.

These positive and negative edge signals in the lines 65 and 67 are also connected as two inputs to an OR-gate 159, whose output is connected as one input to another OR-gate 161, an output of the OR-gate 161 being connected to the load input 111 of the eight bit digital counter 101. These edge signals cause the counter 101, during a demodulate (learning) mode, to load the contents of the hardwired circuit 127 into the counter 101 as a starting point in its counting sequence. In a pulse generating mode, the terminal count pulse in the line 51 is also connected to the load input 111 through the OR-gates 159 and 161. In order to initiate a pulse generating operation, before terminal count pulses exist in the line 51, the control signal in the line 149 causes a circuit 163 to emit a single pulse, after which the pulse generating operation proceeds without any further control intervention by the contents of the control registers or the CPU 23. The terminal count pulses in the line 51 thereafter cause the counter 101 to be re-loaded and to commence counting. The counter 101 is also loaded by an active signal in a third input to the OR-gate 161, from an output of an AND-gate 162. That signal is active during a terminal count pulse from counter 201 in the line 55 when the control signal in line 151 is active.

In order for the 8-bit counter 101 to be enabled by a proper signal in its input 113, all three inputs to an AND-gate 165 must be active. One of those inputs is the control signal in the line 147 after being inverted by an inverter 167. That is, the counter 101 will not be enabled when the bits D0 and D1 of the register 47 are both zero but can be enabled with any other combination of those two bits, therefore acting as a general enable under CPU control. A second input to the AND-gate 165, which is required to be active before the counter 101 is enabled, is the signal in line 53. This signal is the output of an OR-gate 169, which has as inputs a timer start control signal in line 149 and an output of an NAND-gate 171. The NAND-gate 171 assures that both the 16-bit counter of the counter circuits 33 (FIG. 1) and the 8-bit counter 101 are not enabled at the same time when the value of the bits D0 and D1 of the register 47 are zero and one, respectively. This particular pulse generating mode is called the "one-shot" mode, wherein the counter circuits 31 and 33 (FIG. 1) alternately and automatically operate in timed sequence by signals exchanged between them.

A third input to the AND-gate 165 is an output of an OR-gate 164, which in turn has as inputs the line 66 and the signal in the line 153 after being inverted by the inverter 166. Thus, the counter 101 will not be enabled, when in the demodulate mode, except upon the occurrence of the first positive edge of an incoming signal after bits D01 are both set to one.

A flip-flop circuit 173 controls the state of the multiplexer 107 in switching between the registers 103 and 105. When the flip-flop is set, the multiplexer 107 connects the output of the register 103 to its output, while connecting the register 105 to the multiplexer 107 when it is reset. The output of an AND-gate 175 is connected through an OR-gate 174 to a D input of the flip-flop 173. The AND-gate 175 allows the load pulses in the line 111 to pass through to set the flip-flop 173 when its second input, connected to the control line 151 through an inverter 172, is active, a condition that exists when the control register 47 bits D0 and D1 are anything other than a zero and a one, respectively. But when the control register 47 bits D0 and D1 are respectively 0 and 1, placing the system into its one-shot mode, the AND-gate 162 allows the terminal count signal TC16 from the circuits 33 (FIG. 1) to set the flip-flop 173, by providing a second input to the OR-gate 174. The flip-flop 173 is cleared when the TMR control register bits D1,D0 are 0,0, thus causing the multiplexer 107 to be connected to the register 103. Thus, upon changing (enabling the timer) to any operating mode, the register 103 will be the first register used.

The circuit of FIG. 4 also has a feature that allows for the contents of the counter 101 to be loaded into the register 103 whenever the counter 101 is stopped by the D1,D0 control bits of the register 47 being set to 0,0. A pulse generator 178 issues a pulse when this occurs. That pulse is connected as second inputs to OR-gates 154 and 177. The pulse thus causes the multiplexer 129 to connect the bus 115 to the input of the register 103 and the register 103 to simultaneously load the counter value present on the bus 115. The counter 101 has been stopped by the bits D1,D0 of the register 47 being written to 0,0 as a result of one input to the AND-gate 165 being disabled as a result.

Referring to FIG. 5, operation of the 16-bit counter circuits 33 of FIG. 1 will now be similarly given. A 16-bit counter 201 and a 16-bit holding register 203 are the primary components, only one such register being shown in this embodiment. A multiplexer 205 allows the counter 201 to be loaded either with the contents of the register 203, when operating in the pulse generating mode, or with a fixed count from circuits 207, when operating in the pulse demodulate mode, that fixed value generally being the maximum count of the counter 201. This is controlled by the control signal in the line 153, the same manner described with respect to FIG. 4.

A multiplexer 209 responds to the same control signal in the line 153, through an OR-gate 212, to connect the input of the holding register 203 either to the internal bus 25, when in the pulse generating mode, or to an output 211 of the counter 201, when in a pulse demodulating mode. An AND-gate 213 enables a line 214 to be passed through to an output line 218 when the system is in the demodulate mode as enabled by the line 153. The line 214 is driven by an OR-gate 215 which has two inputs, the line 29 and the signal generated by the AND-gate 230. The output of the AND-gate 230 becomes active when the 8-bit counter terminal count signal in line 51 occurs while the system is set into its one-shot mode, an event detected by the control signal in line 151 being active. The line 151 is connected as a second input to the AND-gate 230. The output of the AND-gate 213 drives a line 218 and is one of two inputs to the OR-gate 216 which drives the line 210 to allow the 16-bit register 203 to be loaded.

An output of an OR-gate 238 is connected as an input to the AND-gate 237. The OR-gate 238 has as a first input the first positive edge signal in the line 66 and as a second input a signal indicating the system is in the pulse demodulation mode, this second input signal being obtained by inverting the control signal in the line 153 by an inverter 240. This will enable the counter 201, when the system is in the demodulation mode, only upon the input circuits 63 (FIGS. 1 and 6) detecting the first occurrence of a positive edge on an input 19 after the TMR control register bits D1,D0 have been programmed to 1,1. The other input to the OR-gate 216 comes from a pulse generator 228 that emits a pulse in response to a signal in a control line 227 becoming inactive. The line 227 is part of the control signal lines 45 (FIG. 1). The signal in the line 227 is active when the D2 bit of the register 47 (FIG. 2) is a one, and inactive when that bit is a zero. This is part of the automatic loading of the contents of the counter 201 into the register 203 upon the counter 201 being disabled by the CPU 23 changing the D2 bit of register 47 from a 1 to a 0. This same output of the pulse generator 228 is routed through the OR-gate 216, as a second input to that gate, and as an input to the OR-gate 212 in order to cause the multiplexer 209 to connect the bus 211 as an input to the register 203 in order to effect the proper loading.

In order for the CPU 23 (FIG. 1) to be able to read the contents of the register 203, a tri-statable buffer 221 is provided to connect the output of the register 203 with the internal bus 25. The buffer 221 connects the output of the register 203 to the internal bus 25 in response to an active read signal from the CPU 23 in one of the read circuits 27.

Similar to the counter circuits 31 described with respect to FIG. 4, the counter circuits of FIG. 5 include logic 223 connected with the output 211 of the counter 201 to determine when the counter has counted down to a terminal count, usually zero, at which time the terminal count pulse is generated in the line 55. A toggle flip-flop 225 receives this terminal count pulse from the line 55 as an input and changes its state at the output 75 at each occurrence of this pulse.

The counter 201 is loaded in response to an active signal in a line 233 that is an output of an OR-gate 231. This OR-gate has three inputs, therefore establishing three alternate conditions that will cause the counter 201 to be loaded. One of these inputs comes from a pulse generating circuit 229 that emits a single pulse when a change occurs in the control signal 227, indicating that the CPU 23 has loaded the bit D2 on the control register 47 with a 16-bit counter enable signal. This starts operation of the counter 201 if the other AND-gate 237 causes the counter to be enabled. After this starting procedure, the counter 201 is loaded upon the occurrence of its terminal count being reached, the line 55 providing a second input to the OR-gate 231. A third input to the OR-gate 231 is the output of the AND-gate 230 which passes through the 8-bit counter terminal count pulses in the line 51 when the system is in its one-shot pulse generating mode as indicated by an active signal on the control line 151.

The counter 201 is enabled with an appropriate signal at an input 235 and an AND-gate 237 provides that signal. The AND-gate 237 has three inputs, one being the control line 227 which carries an active signal when the bit D2 of the register 47 is a one. Through this control bit, the CPU 23 can turn the counter 201 on and off. A second input to the AND-gate is the 16-bit counter enable signal 57. The signal in the line 57 appears at an output of a NAND-gate 241. The NAND-gate 241 has as its inputs the control signals in line 53 and 151. This causes the 16-bit counter 201 to be disabled when the 8-bit counter is enabled and the system is operating in its one-shot mode.

A third input to the AND-gate 237 is the OR-gate 238 output. This input is active when the system is in its pulse generating mode but, when in the demodulating mode, is active only in response to a first positive edge signal in the line 66.

As with the 8-bit counter circuit of FIG. 4, the circuit of FIG. 5 includes a multiplexer 245 and selects one of the clock signals in the circuit 61 for both application to the counter over a line 247 and providing an output signal from the integrated circuit. A multiplexer 245 is controlled by bits D2 and D3 of PWM control register 49 (FIG. 3). By providing for selection of the clocks for the counter 101 and 201, the width of pulses which may be generated or monitored by them is expanded. For a very long pulse duration, for example, that goes beyond the time it takes for one of the counters to reach terminal count, the count can be effectively lengthened by choosing a slower clock speed, although the resolution is reduced as a result.

When the D0 and D1 bits of the register 47 (FIG. 2) are respectively 0 and 1, the circuit operates in its one-shot mode. In this mode, pulses are generated by a cooperative operation of both the 8-bit counter 101 and the 16-bit counter 201. One of them operates at a time, in alternating sequence. This ability is particularly advantageous when one of these durations happens to be considerably longer than the other. The 16-bit counter 201 is used for the longer duration pulse portion because of its longer count and the 8-bit counter 101 used to control the short duration portion.

The input circuit 63 of the system of FIG. 1 is illustrated in FIG. 6. It is utilized when the system is operating in the pulse demodulate mode. An incoming, unknown pulse signal in a line 19 is connected through a demultiplexer 301 to an edge detecting circuit 303. The circuit 303 generates a pulse in the line 65 on each occurrence when the incoming signal on line 19 has a positive going edge and a pulse in the line 67 on each occurrence of a negative going edge. A line 66 is set high by the circuit 303 when the first positive edge of the incoming signal is detected after the system has been placed into its demodulating mode by bits D1,D0 of the register 47 being written to a 1,1 from some other state, and reset low upon these bits D1,D0 being changed. The optional demultiplexer 301 is provided so that the input signal line 19 can be connected to another line 305 in cases where the system of FIG. 1 is combined with other electronic systems on a single chip and the input circuit 19 is desired to be switchable between them. The demultiplexer 301 is controlled by the value of bit D4 of the register 49 (FIG. 3).

The output circuit 77 of the system of FIG. 1 is illustrated in FIG. 7. The outputs 73 and 75 of the two counter circuits 31 and 33 are combined in a logic circuit 307 to form an output that is presented through a multiplexer 309 on output line 15. The logic circuits 307 preferably provide for a selectable combination of these output signals either by logically ANDing, ORing, NORing or NANDing them together. One of these functions is selected by control signals in lines 311 that carry the values of bits D3 and D4 of the control register 47 of FIG. 2. The multiplexer 309 is optionally provided in the case where the output line 115 is serving double duty by at times being connected to other circuits provided on the same integrated circuit chip. The multiplexer 309 is controlled by bit D7 of the control register 49 shown in FIG. 3.

It is convenient, at times, to have available at the output of the system the individual outputs 73 and 75 of the counter circuits (FIG. 1). Thus, a multiplexer 313, responsive to a bit D5 of the FIG. 3 control register 49, provides connectability between the lines 73 and the output line 17. Similarly, a multiplexer 315, responsive to the bit D6 of the control register 49 of FIG. 3, allows for direct connection of the line 75 to the output line 13.

With reference to FIG. 8, several examples of operation of the system described with respect to FIGS. 1–7 is given, when the system is operating in its pulse generating mode. Referring initially to FIG. 8A, an example output signal is shown that is best generated by the 8-bit counter circuits 31 themselves, without participation of the 16-bit counter circuits 33. A duration 317 of the high level of this signal is set by the value loaded into the register 103 of FIG. 4, and a low level duration 319 set by a value loaded in the register 105. The pulse signal of FIG. 8A appears at the output 17 directly from the 8-bit counter circuits 31 (FIG. 1). The 8-bit counter 101 (FIG. 4) is alternatively loaded with the contents of the registers 103 and 105, beginning with the register 103 upon a start condition, and immediately enabled to count from the value loaded to the terminal count recognized by the logic 117. The terminal count signal in the line 51 causes the multiplexer 107 to alternately switch between connecting the registers 103 and 105 to the counter 101 and load the respective value into the counter. The value of the control bits D0 and D1 of the register 47 are set by the CPU 23 to have respective values of 1 and 0, and the bit D2 to have the value 0, in order to effect this operation. In this specific pulse generation example, once the CPU has loaded the contents of the control registers 47 and 49 (FIGS. 2 and 3, respectively), and loaded the pulse duration values in the registers 103 and 105 (FIG. 4), the CPU has no active intervention with the hardware system of FIGS. 2–7, until a change in its mode or characteristic of pulse generation is to be made.

Referring to FIG. 8B, an example of use of both of the counters 101 and 201 is given. The 8-bit counter 101, in this example, for simplicity, is shown to be generating a series of pulses similar to that of FIG. 8A. Each pulse has an "on" duration indicated by 321, and an "off" duration indicated by 322. Superimposed over that train of pulses is an envelope pulse signal 323 having characteristics controlled by the counter circuits 33 (FIG. 4). In this case, the output circuit 77 (FIG. 7) is set to logically AND the counter circuit output signals in lines 73 and 75 together. Bits D3 and D4 of the register 47 (FIG. 2) are set to 00 so that the logic circuits 307 (FIG. 7) perform the AND function. The signal of FIG. 8B appears in line 15. In order to cause the counters to operate in this way, the bit D2 of the register 47 is set to a 1 in order to enable the 16-bit counter 201, and the bits D0 and D1 are set respectively to 1 and 0 to enable the 8-bit counter 101.

The respective high and low envelope durations x and y of FIG. 8B are established by the CPU 23 (FIG. 1) writing into the register 203 (FIG. 5) the appropriate starting values for the counter 201. If the durations of x and y are different, or if either changes from cycle to cycle, this value is dynamically changed. While the counter 201 is counting down from the x value loaded into it from the register 203, the value of y is written into the register 203. While the counter 201 is then counting down from the y value loaded into it, a new value of x may be written into the register 203, and so on. This register loading by the CPU 23 is synchronized with the otherwise automatic operation of the circuit by receiving an interrupt in line 71 (FIG. 1) each time the counter 201 reaches its terminal count. The interrupt circuit 69 (FIG. 1) is set to provide an interrupt in response to each terminal count pulse in the line 55. The interrupt circuit 69 is selectively set by the CPU 23 by appropriately loading bit D7 of the control register 47

(FIG. 2) to provide an interrupt upon desired occurrences of the various pulses received in lines 51, 55, 65 and 67. Bits D6 and D5 of the control register 47 (FIG. 2) are read by the CPU 23 to determine what caused the interrupt.

FIG. 8C illustrates another cooperative effort by the two counter circuits 31 and 33 (FIG. 1), operating in the one-shot mode previously discussed. In this case, a pulse signal having a relatively short duration high level 325 is alternated with a relatively long duration low period 327. This operation results from the bits D0 and Eli of the register 47 being set respectively to 0 and 1. The short duration high level 325 is controlled by the value placed by the CPU 23 into the register 103 (FIG. 4), while the long duration 327 is determined by the value placed in the holding register 203 (FIG. 5) by the CPU 23. Once this is done and operation initiated by the CPU 23 writing bits D1 and D0 of the register 47 (FIG. 2) with 1,0, the counter 101, which is accessed first, and then the counter 201, alternately operate one at a time to generate this repetitive pulse train.

FIG. 8D shows a non-repetitive pulse signal that can be generated by the 8-bit counter circuits 31 alone or by a combination of the 8 and 16-bit counters 31 and 33. The difference in the signal of FIG. 8D is that the pulse widths, both high and low, are different each cycle, for at least a number of cycles. This requires that the CPU 23 interactively load the new pulse width values into the appropriate register(s) 103,105 and 203 (FIGS. 4 and 5).

The loading of the registers 103, 105 and 203 by the CPU 23 does take time but the system being described allows this to be accomplished while the circuit is automatically performing some other function for which the new register contents are not yet required. Once the contents of the register 103 (FIG. 4) are loaded into the counter 101, for example, then that register 103 is unused for at least the time that the counter 101 is counting down to its terminal count. During that time, the register 103 can be reloaded with a different value for the next pulse duration. If both registers 103 and 105 are alternatively being loaded into the counter 101, that provides even more time for a register whose contents has just been transferred to the counter 101 to be loaded with a new value. Similarly, as previously discussed with respect to FIG. 8B, the register 203 of FIG. 5 is reloaded by the CPU 23 after its contents have been transferred to the counter 201 and while that counter is counting down from that value to its terminal count.

The interrupt control circuit 69 (FIG. 1) tells the CPU 23, through the interrupt signal in the line 71, when the CPU should load one of these registers with a new value. This is because the interrupt control circuit 69 receives both of the terminal count signals in the lines 51 and 55 from each of the counter circuits 31 and 33. These are utilized when the system is in a pulse generating mode. When in a pulse demodulating mode, on the other hand, the interrupt circuit 69 generates an interrupt to the CPU 23 upon each occurrence of the negative and positive going edge pulses occurring in the line 67 and 65 respectively. This tells the CPU 23 to read an appropriate one of the registers 103, 105 and 203 which, in the demodulating mode, contains a counter output that has measured the duration of a pulse signal between edges. This is the information that is acquired by the CPU 23 in the demodulating mode in order to acquire the information necessary for the circuit to learn characteristics of a pulse signal in enough detail that, if desired, it can be regenerated by the same system if operating in the pulse generating mode. The interrupt circuits 69 are appropriately set to provide desired interrupts by the values of bit positions D7, D6 and D5 of the register 47 (FIG. 2).

A flow diagram of FIG. 9A generally shows the operation of the CPU 23 in controlling the system of FIGS. 1–7 when operating in a pulse generation mode. FIG. 9B provides an expanded view of the FIG. 8D generated waveform example, being annotated to show the sequence of operating steps of the system that causes this type of waveform to be generated. The example of FIG. 9B uses only the counter circuits 31 to generate the waveform, by alternately loading the registers 103 and 105 with new pulse duration times. Of course, in another example, the counter circuits 33 could also be utilized by reloading the register 203, in place of the register 105, alternately with the register 103.

When the system is started, as indicated by a step 401 of FIG. 9B, those of the registers 103, 105 and 203 which are being utilized are loaded by the CPU 23 with values representing durations between edges of the pulse signal being generated. In an accompanying step 403, the contents of the control registers 47 and 49 (FIG. 2 and 3) are loaded. Once that occurs, as indicated by a block 405, the hardware system of FIG. 1–7 is allowed to operate. The CPU 23 may issue a command to stop one or both of the counters 101 and 201, as indicated by a step 407, by loading bits D2,D1,D0 of the register 47 (FIG. 2) accordingly.

Absent such a command, the CPU 23 is constantly alert to receiving an interrupt in the line 71, as indicated by a step 411. Until an interrupt has been received, the hardware operates without change in its register contents by the CPU. Once an interrupt is received during the pulse generating mode, the CPU is caused to reload one of the registers 103,105 or 203 as indicated by a step 413. This reloading will occur only when the CPU 23 is being controlled by software that specifies it is to react in this way to an interrupt signal. In the case where a repetitive signal of constant high and low durations is being generated, such as illustrated in FIGS. 8A–8C, these registers do not need to be dynamically reloaded in this way and the CPU 23 will ignore any hardware generated interrupt that reaches it.

Although the various aspects of the present invention have been described with respect to a specific embodiment thereof, it will be understood that the invention is entitled to protection within the full scope of the appended claims.

It is claimed:

1. A pulse generating system, comprising:
   at least first and second digital counters each characterized by counting from a value loaded thereinto and generating respective first and second time count signals when having counted to respective first and second preset levels,
   at least first and second registers respectively associated with said first and second counters,
   logic circuit means responsive to the first counter time count signal for loading a value of the second register into the second counter and commencing the second counter's count,
   logic circuit means responsive to the second counter time count signal for loading a value of the first register into the first counter and commencing the first counter's count, and means receiving both of the first and second time count signals for combining these first and second time count into a single signal having high and low durations controlled by the values of said first and second registers, said combining means including means responsive to a control signal for combining the first and second time count signals according to any one of AND, OR, NAND and NOR functions as specified by said control signal.

2. The system according to claim 1 wherein said at least first and second counters are further characterized by one of the first and second counters having a maximum count that is greater than that of the other of the first and second counters.

3. The system according to claim 1 wherein said at least first and second counters are further characterized by one having a maximum count that is greater than that of the other.

4. The system according to claim 1 which additionally comprises means responsive to a control signal for controlling a speed of counting of at least one of said at least two digital counters.

5. A system having pulse generating and demodulating modes, comprising:
   at least one digital counter adapted to produce a count,
   a storage register, means, operably connected to said at least one digital counter and operably connected to said storage register, and operable when the system is in a pulse generating mode for controlling the count of said at least one counter according to a value stored in said register,
   means, operably connected to said at least one digital counter, and operable when the system is in a pulse demodulating mode for controlling the count of said at least one counter according to a preset fixed value, and
   means operable when the system is in a pulse demodulating mode for storing counts of said at least one counter in said register.

6. The system according to claim 5 which additionally comprises:
   a central processing unit,
   means operably connected to said at least one register and controlled by said central processing unit when the system is in a pulse generating mode for loading the value of said register, and
   means operably connected to said at least one register and controlled by said central processing unit when the system is in a pulse demodulating mode for reading the value of said register.

7. The system according to claim 6 wherein all of the recited elements are provided on a single integrated circuit chip.

8. The system of claim 5, wherein said two count controlling means include a multiplexer for switching between the fixed value and the value stored in the first register, said multiplexer under the control of a control signal in an additional register written to by a central processing unit.

9. The system of claim 5, wherein the means controlling the count according to a value stored in said register is adapted to load the counter with the value in the register and start the count down of the counter, and wherein the means controlling the count according to a preset fixed value is adapted to load the counter with the preset fixed value and start the count down of the counter.

10. A system having pulse generating and demodulating modes, comprising:
   first and second digital counters,
   first, second and third storage registers,
   means including a central processing unit for reading values from and writing values to the first, second and third registers;
   means, operably connected to said first digital counter and operably connected to said first and second storage register, and operable when the system is in a pulse generating mode for loading contents of at least one of the first and second registers into the first counter to provide a starting count,
   means, operably connected to said second digital counter and operably connected to said third storage register, and operable when the system is in a pulse generating mode for loading contents of the third register into the second counter to provide a starting count,
   means, operably connected to said first and second counter, and operable when the system is in a pulse demodulating mode for loading first and second preset values respectively into the first and second counters to provide starting counts therein,
   means, operably connected to said first counter and operably connected to said first and second storage register, and operable when the system is in a pulse demodulating mode for storing resulting counts of said first counter in at least one of said first and second registers, and
   means, operably connected to said second digital counter and operably connected to said third storage register, and operable when the system is in a pulse demodulating mode for storing resulting counts of said second counter in said third register.

11. The system according to claim 10 wherein the reading and writing means includes means controlled by said central processing unit when the system is in a pulse generating mode for loading the contents of said first, second and third registers, and
   means controlled by said central processing unit when the system is in a pulse demodulating mode for reading the contents of said first, second and third registers.

12. The system according to claim 11 wherein the pulse generating system is provided on a single integrated circuit chip.

13. The system according to claim 10 wherein said second counter is characterized by having a maximum count that is greater than that of the first counter.

14. The system according to claim 10 which additionally comprises means responsive to a control signal for controlling a speed of counting of at least one of said first and second counters.

15. The system according to claim 10 which additionally comprises means operable when the system is in the pulse generating mode for causing alternative operation of the first and second counters.

16. The system according to claim 10 wherein the first and second register loading means includes means for alternatively loading contents of the first and second registers into the first counter.

17. A pulse generating and demodulating system provided on a single integrated circuit chip, comprising:
   a central processing unit (CPU) and a controlling program stored in memory, first, second, third and fourth registers operably connected with the CPU in a manner to have their contents read and written by the CPU, means responsive to a first control signal stored in the fourth register for configuring the system into one of a pulse generating or pulse demodulating operating mode, first and second digital counters, first and second two-state circuits respectively connected to said first and second counters to provide outputs that are toggled between two states upon their respective first and second counters reaching respective first and second preset terminal counts, means, operably connected to the fourth register, and receiving the toggled output signals from said first and second two-state circuits for logically combining the toggled out-put signals in one of a plurality of ways specified by a second control signal stored in the fourth register, means, operably connected to the fourth register and to the first counter, and responsive to enablement from a third control signal stored in the fourth register when the system is configured in the pulse generating mode for causing the first counter, in response to the first counter terminal count, to either alternatively begin counting from the contents of the first and second registers or to begin counting in each instance from the contents of the first register, means, operably connected to the fourth register and to the second counter, and responsive to enablement from a fourth control signal stored in the fourth register when the system is configured in the pulse generating mode for causing the second counter, in response to the second counter terminal count, to begin counting in each instance from the contents of the third register, means, operably connected to the fourth register and to the first and second counter, and responsive to enablement from a fifth control signal stored in the fourth register when the system is configured in the pulse generating mode for causing the first and second counters to alternatively operate in response to the second counter terminal count and the first counter terminal count, respectively, means, operably connected to the fourth register and to the first and second counter, and receiving an input pulse train having rising and falling pulse edges and responsive to a sixth control signal stored in the fourth register for loading and commencing counting of a selected one of said first and second counters upon the occurrence of rising and falling pulse edges in the input pulse train when the system is configured in the pulse demodulating mode, means, operably connected to the fourth register and to the first, second, and third register, and responsive to enablement from the sixth control signal stored in the fourth register when the system is configured in the pulse demodulating mode for disabling the first, second and third registers from providing a beginning count to the first and second counters and instead connecting the first and second counters to respective fixed beginning counts and causing their respective terminal counts to be stored in at least some of said first, second and third registers, and means, operably connected to the fourth register and to the first and second counter, and responsive to seventh and eighth control signals stored in the fourth register for individually selecting one of a plurality of frequencies of clock signals applied to said first and second counters.

18. The system according to claim 17 which additionally comprises means for generating an interrupt to the CPU in response to at least one of the first or second counter terminal count occurring or the rising or falling pulse edges being detected by the input pulse train receiving means.

19. The system according to claim 18 wherein said controlling CPU program includes means responsive to said system being configured into a pulse demodulation mode for causing said CPU to read contents of designated ones of said first, second or third registers in response to an interrupt being sent to the CPU by said interrupt generating means.

20. The system according to claim 18 wherein said controlling CPU program includes means responsive to said system being configured into a pulse generating mode for causing said CPU to write pulse characteristics into designated ones of said first, second or third registers in response to an interrupt being sent to the CPU by said interrupt generating means.

21. The system according to claim 17 wherein said logically combining means includes means responsive to the second control signal for combining said two-state element output signals according to one of AND, OR, NAND and NOR logical functions as specified by said second control signal.

22. The system according to claim 17 wherein said second counter is characterized by having a count higher than said first counter.

23. A system having pulse generating and demodulating modes, comprising:
at least one digital counter adapted to produce a count;
a storage register;
a fixed value storing circuit storing a fixed value, said fixed value stored in the circuit not changing while the system on;
a multiplexer operably connected to said fixed value storing circuit and to said storage register for supplying a start value to the counter, said multiplexer adapted to supply the value stored in the storage register to the counter when the system is in a pulse generating mode and adapted to supply the fixed value to the counter when the system is in a pulse demodulating mode, wherein the value in the storage register is not supplied to the counter when the system is in the pulse demodulating mode;
circuitry adapted to store the end count of the counter into the storage register when the system is in the pulse demodulating mode;
a central processing unit, said central processing unit producing control signals which are stored in a control register, one of said control values controlling the multiplexer;
circuitry operably connected to said at least one register and controlled by said central processing unit when the system is in a pulse generating mode for loading the value into the storage register; and
circuitry operably connected to said at least one register and controlled by said central processing unit when the system is in a pulse demodulating mode for reading the value of said register.

24. A system having pulse generating and demodulating modes, comprising:
- at least one digital counter adapted to produce a count;
- a storage register;
- a fixed value storing circuit storing a fixed value, said fixed value stored in the circuit not changing while the system is on;
- a multiplexer operably connected to said fixed value storing circuit and to said storage register for supplying a start value to the counter, said multiplexer adapted to supply the value stored in the storage register to the counter when the system is in a pulse generating mode and adapted to supply the fixed value to the counter when the system is in a pulse demodulating mode, wherein the value in the storage register is not supplied to the counter when the system is in the pulse demodulating mode;
- circuitry adapted to store the end count of the counter into the storage register when the system is in the pulse demodulating mode;
- a second storage register; and
- a second multiplexer, said second multiplexer adapted to switch between the first and the second storage registers to supply either the value stored in the first or the second register to the first multiplexer, wherein the value supplied to the first multiplexer is supplied to the counter in the pulse generating mode.

25. A method of generating and demodulating a pulse comprising:
- inputting a pulse train from an external source; counting the duration of the up and down portions of the external pulse train using a first counter;
- storing information about the pulse train durations in first and second
- transferring this information to the CPU;
- thereafter, loading values derived from the pulse train duration information from the CPU into the first and second registers;
- loading one of the values from one of the first and second registers into the first counter;
- counting down from the value loaded into the first counter to a terminal value;
- toggling a first output signal when said terminal count is reached;
- loading a third register with an additional value derived from the pulse train duration information into a third register;
- loading the additional value into a second counter;
- counting down in the second counter to a second terminal value;
- producing a second output signal by toggling the second output when said terminal count is reached; and producing a pulse train from the first and second output signals.

26. The method of claim 25, wherein the duration counting step comprises disabling the first, second and third registers from providing a beginning count to the first and second counters and instead connecting the first and second counters to respective fixed beginning counts and causing their respective terminal counts to be stored in at least some of said first, second and third registers responsive to enablement from a first control signal stored in a fourth register, and loading and commencing counting of a selected one of said first and second counters upon the occurrence of rising and falling pulse edges in the input pulse train responsive to a second control signal stored in the fourth register; further comprising
- causing the first and second counters to alternatively operate in response to the second counter terminal count and the first counter terminal count, respectively;
- individually selecting one of a plurality of frequencies of clock signals applied to said first and second counters responsive to third and fourth control signals stored in the fourth register; and
- writing said control signals into the fourth register.

* * * * *

UNITED STATES PATENT AND TRADEMARK OFFICE
CERTIFICATE OF CORRECTION

PATENT NO.   :   5,442,796
DATED        :   August 15, 1995
INVENTOR(S)  :   Zastrow et al.

It is certified that error appears in the above-indentified patent and that said Letters Patent is hereby corrected as shown below:

In Column 13, line 3 in Claim 1:
    replace: "time count into a single signal having high and low" with:

--time count signals into a single signal having high and low--

In Column 17, line 36 in Claim 25:
    replace: "first and second" with

--first and second registers;--

Signed and Sealed this

Seventh Day of May, 1996

Attest:

BRUCE LEHMAN

Attesting Officer

Commissioner of Patents and Trademarks